US012641713B2

(12) United States Patent
Berthier et al.

(10) Patent No.: US 12,641,713 B2
(45) Date of Patent: May 26, 2026

(54) RF CONNECTOR MECHANICALLY CONFIGURABLE BETWEEN A WIRELESS AND WIRED RADIO FREQUENCY TRANSMISSION AND A METHOD OF OPERATING THEREOF

(71) Applicants: UNIVERSITE DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR); STMICROELECTRONICS France, Montrouge (FR)

(72) Inventors: Alexandre Berthier, Bordeaux (FR); Anthony Ghiotto, Begles (FR); Eric Kerherve, Pessac (FR); Lionel Vogt, La Rochette (FR)

(73) Assignees: Microelectronics France, Montrouge (FR); UNIVERSITE DE BORDEAUX, Bordeaux (FR); CENTRE NATIONAL DE LA RECHERCHE SCIENTIFIQUE, Paris (FR); INSTITUT POLYTECHNIQUE DE BORDEAUX, Talence (FR)

( * ) Notice: Subject to any disclaimer, the term of this patent is extended or adjusted under 35 U.S.C. 154(b) by 396 days.

(21) Appl. No.: 18/247,582

(22) PCT Filed: Oct. 2, 2020

(86) PCT No.: PCT/FR2020/051734
§ 371 (c)(1),
(2) Date: Mar. 31, 2023

(87) PCT Pub. No.: WO2022/069806
PCT Pub. Date: Apr. 7, 2022

(65) Prior Publication Data
US 2024/0023230 A1 Jan. 18, 2024

(51) Int. Cl.
| | |
|---|---|
| *H05K 1/02* | (2006.01) |
| *H01P 3/16* | (2006.01) |
| *H01Q 13/08* | (2006.01) |

(52) U.S. Cl.
CPC ............. *H05K 1/0243* (2013.01); *H01P 3/16* (2013.01); *H01Q 13/085* (2013.01); *H05K 2201/10098* (2013.01); *H05K 2201/10189* (2013.01)

(58) Field of Classification Search
CPC .. H01P 5/107; H01P 3/16; H01P 5/087; H01P 3/121; H01P 11/002; H01P 11/001;
(Continued)

(56) References Cited

U.S. PATENT DOCUMENTS

| | | | | |
|---|---|---|---|---|
| 9,728,833 | B2 * | 8/2017 | Okada | ..................... H01P 5/107 |
| 2014/0333388 | A1 * | 11/2014 | Tamura | ................... H01P 5/107 |
| | | | | 333/26 |

(Continued)

FOREIGN PATENT DOCUMENTS

| | | |
|---|---|---|
| CN | 109075420 A | 12/2018 |
| CN | 110088976 A | 8/2019 |

(Continued)

OTHER PUBLICATIONS

Dolatsh, N., et al., "Fully packaged millimetre-wave dielectric waveguide with multimodal excitation", Electronics Letters, vol. 51, No. 17, Aug. 20, 2015, pp. 1339-1341.
(Continued)

*Primary Examiner* — Golam Sorowar
(74) *Attorney, Agent, or Firm* — Slater Matsil, LLP

(57) ABSTRACT
In accordance with an embodiment, a connector is mechanically configurable between a wireless radio frequency transmission and a wired radio frequency transmission via a cylindrical dielectric radio frequency waveguide. The con-
(Continued)

nector includes: a first package assembled to a printed circuit board provided with a radio frequency antenna; and a second package configured to be assembled to the waveguide, wherein the second package is configured to be removably assembled to the first package in the wired radio frequency transmission configuration and is separated from the first package in the wireless radio frequency transmission configuration.

20 Claims, 4 Drawing Sheets

(58) Field of Classification Search
CPC .. H01P 3/165; H01P 5/08; H01P 3/123; H01P 5/184; H01P 5/00; H01P 5/12; H01P 5/024; H01P 3/12; H01P 1/2002; H01Q 13/02; H01Q 1/2283; H01Q 21/064; H01Q 1/50; H01Q 9/065; H01Q 19/108; H01Q 19/30; H01Q 13/10; H01Q 1/3233; H01Q 21/005; H01Q 13/0283; H01Q 21/0087; H01Q 13/24; H01Q 21/0006; H01Q 1/38; H05K 2201/10098; H05K 1/024; H05K 1/00; H05K 2201/09618; H05K 1/0243; H05K 1/0239; H05K 2201/0187; H05K 2201/0195; H05K 1/0237; H05K 1/116; H05K 1/144; H05K 1/0206; H05K 1/0242
See application file for complete search history.

(56) References Cited

U.S. PATENT DOCUMENTS

| | | | |
|---|---|---|---|
| 2015/0364829 A1* | 12/2015 | Tong ..................... | H01Q 23/00 |
| | | | 343/834 |
| 2016/0036114 A1 | 2/2016 | Okada | |
| 2016/0308266 A1* | 10/2016 | Hammerschmidt ... | G02B 1/045 |
| 2017/0059356 A1 | 3/2017 | Kallman et al. | |
| 2017/0271738 A1* | 9/2017 | Smith, Jr. ................ | H01P 3/12 |
| 2018/0115051 A1* | 4/2018 | Nguyen .............. | H05K 9/0026 |
| 2019/0013563 A1 | 1/2019 | Takeda et al. | |
| 2019/0305434 A1* | 10/2019 | Panis ..................... | H01Q 13/08 |
| 2021/0218127 A1* | 7/2021 | Lampersberger ...... | H01Q 21/20 |
| 2021/0408653 A1* | 12/2021 | Correas-Serrano ..... | H01P 5/022 |

FOREIGN PATENT DOCUMENTS

| | | | | |
|---|---|---|---|---|
| DE | 102019118733 | B3 | 6/2020 | |
| JP | 2014199968 | A * | 10/2014 | .............. H01P 5/107 |
| WO | 2017191409 | A1 | 11/2017 | |
| WO | WO-2018014951 | A1 * | 1/2018 | .......... H01Q 1/2283 |
| WO | 209133195 | A1 | 7/2019 | |

OTHER PUBLICATIONS

Kim, Yanghyo et al., "High-Speed mm-Wave Data-Link Based on Hollow Plastic Cable and CMOS Transceiver", IEEE Microwave and Wireless Components Letters, vol. 23, No. 12, Dec. 2013, 3 pages.
Van Thienen, Niels, et al., "An 18Gbps Polymer Microwave Fiber (PMF) Communication Link in 40nm CMOS", ESSCIRC Conference 2016: 42nd European Solid-State Circuits Conference, Sep. 12-15, 2016, pp. 483-486.

* cited by examiner

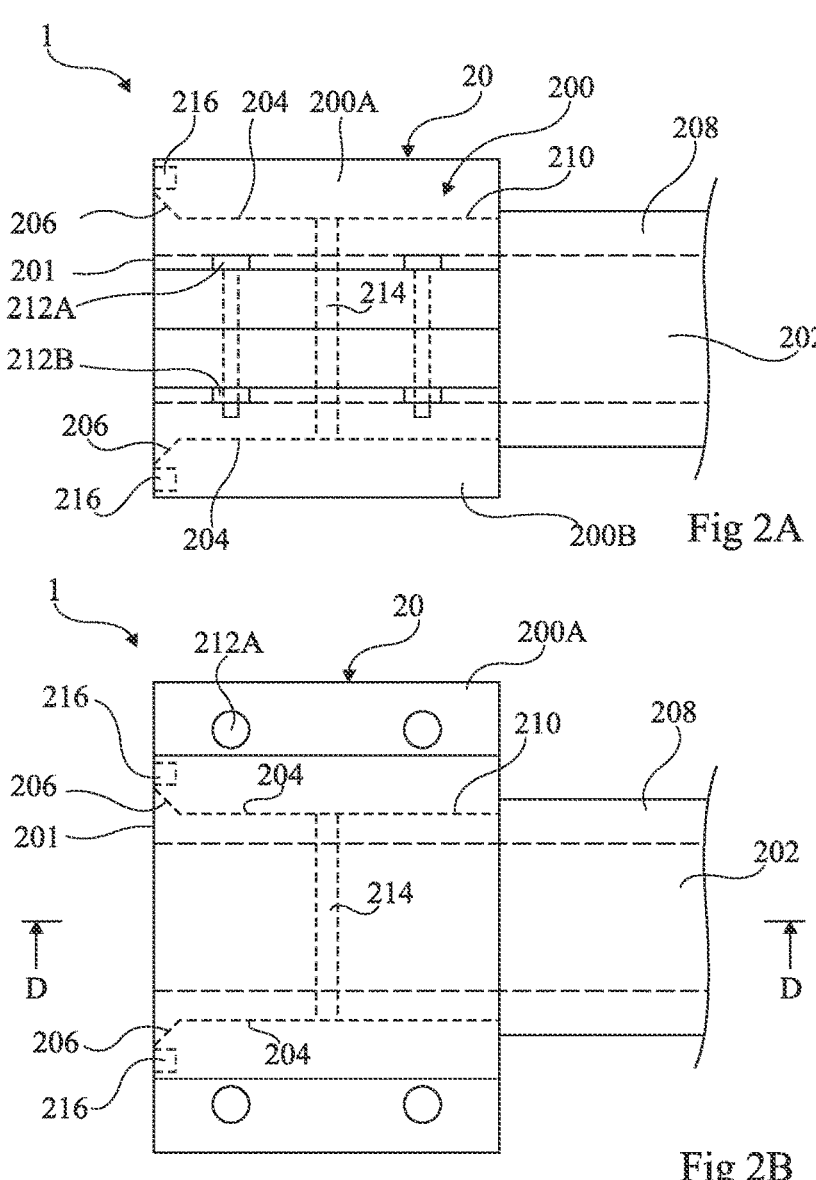
Fig 2A
Fig 2B
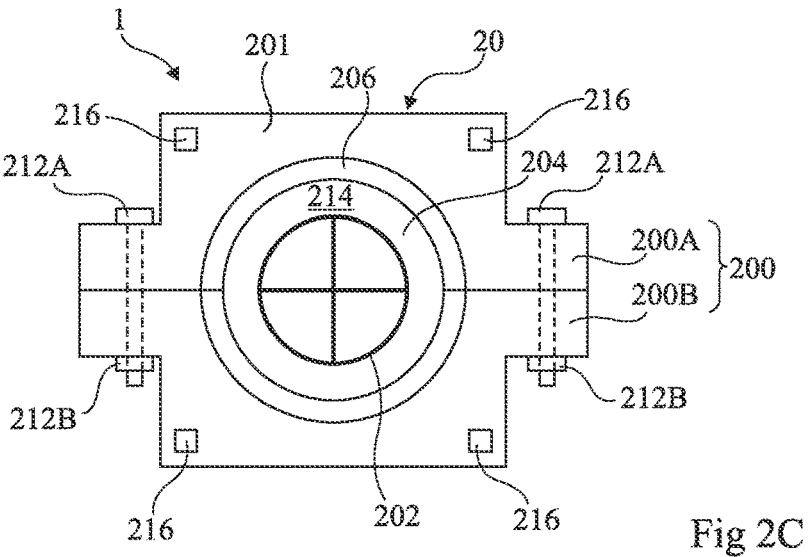
Fig 2C

RF CONNECTOR MECHANICALLY CONFIGURABLE BETWEEN A WIRELESS AND WIRED RADIO FREQUENCY TRANSMISSION AND A METHOD OF OPERATING THEREOF

CROSS-REFERENCE TO RELATED APPLICATIONS

This application is a 371 national phase filing of PCT Application No. FR2020/051734, filed on Oct. 2, 2020, which application is hereby incorporated herein by reference.

TECHNICAL FIELD

The present disclosure generally concerns electronic circuits, and more particularly an RF connector.

BACKGROUND

Radio frequency waves or millimeter waves having a wavelength in the range, for example, from 1 mm to 1 cm, allow data transmissions at relatively high rates. Further, the radio frequency range comprises non-licensed bands such as, for example, the 60-GHz band, for wireless data transmission.

The article, "An 18 Gbps Polymer Microwave Fiber (PMF) Communication Link in 40 nm CMOS," by Niels Van Thienen et al., ESSCIRC Conference 2016: 42nd European Solid-State Circuits Conference, Lausanne, 2016, pp. 483-486, discloses a wired data transmission, via a microwave polymer fiber. More particularly, FIG. 7 of this article, not shown herein, shows a device comprising a radio frequency signal transmit/receive chip Rx/Tx, assembled on a substrate integrated waveguide (SIW) of a printed circuit board (PCB). The SIW waveguide is coupled to an antenna with a conical slot of the printed circuit board, itself coupled to a plastic waveguide (PWG). A metal package forms a shield around the end of the SIW waveguide and the end of the plastic waveguide, and enables to align the waveguides together. This shield however does not enable to mechanically hold the SIW waveguide. The assembly of the PCB board and of the metal package forms a radio frequency connector, between chip Rx/Tx and the plastic waveguide.

The above-described radio frequency connector allows a wire link to transmit data over a distance of one or a plurality of meters by means of radio frequency waves.

Other radio frequency connectors between an integrated circuit chip and a plastic waveguide, or dielectric waveguide (DWG), adapted to radio frequency waves, are known.

SUMMARY

It is desirable to have a radio frequency connector which allows not only a wired data transmission via a dielectric or plastic waveguide, but also a wireless data transmission. It would then for example be desirable for the connector to allow a wireless data transmission in the non-licensed 60-GHz band.

An embodiment provides a radio frequency connector enabling to implement a radio frequency data transmission over a wire link, via a plastic or dielectric waveguide, or over a wireless link, preferably complying with the radio frequency transmission standards in force in the considered radio frequency transmission band.

An embodiment provides a connector mechanically configurable between a wireless radio frequency transmission and a wired radio frequency transmission via a cylindrical dielectric radio frequency waveguide, the connector comprising: a first package assembled to a printed circuit board provided with a radio frequency antenna; and a second package configured to be assembled to the waveguide. The second package is configured to be removably assembled to the first package in a wired transmission configuration and is separated from the first package in a wireless transmission configuration.

According to an embodiment, the first package comprises a first cavity having a circular transverse cross-section around the antenna, the first cavity emerging onto a first surface of the first package and having a wall made of a material configured to block radio frequency waves; the second package comprises a second cavity having a circular transverse cross-section around an end of the waveguide when the waveguide is assembled to the second package, the second cavity emerging onto a second surface of the second package and having a wall made of a material configured to block radio frequency waves; and the first and second surfaces are configured to be in contact and the first and second cavities are configured to be placed end-to-end in a wired transmission configuration.

According to an embodiment, the first and second cavities placed end-to-end define a third cavity, an area of coupling of the antenna to the waveguide being arranged in the third cavity.

According to an embodiment, a diameter of the third cavity is larger at the level of the coupling area.

According to an embodiment, the first cavity comprises a chamfer on the side of the first surface and the second cavity comprises a corresponding chamfer on the side of the second surface.

According to an embodiment, the first cavity is longitudinally aligned with a transmission direction of the antenna and the second cavity is longitudinally aligned with the end of the waveguide when the waveguide and the second package are assembled, the second cavity being longitudinally aligned with the first cavity when the second package is removably assembled to the first package.

According to an embodiment, the waveguide is surrounded with a foam sheath upstream of the end, the second package being configured to tightly encircle the sheath of the waveguide while exerting a pressure on the sheath when the waveguide and the second package are assembled, the end of the waveguide comprising no sheath in the second cavity.

According to an embodiment, the second package comprises, on the side of the second cavity opposite to the second surface, a ring having an inner diameter greater than the diameter of the waveguide and smaller than the diameter of the sheath, the second package being configured so that the sheath abuts against the ring when the waveguide and the second package are assembled.

According to an embodiment, the second package is configured so that the end of the waveguide is flush with the second surface, or is recessed by less than one millimeter with respect to the second surface, when the waveguide and the second package are assembled.

According to an embodiment, the second package comprises two portions fastened to each other, each of the two portions defining a portion of the second cavity, a contact plane between the two portions being parallel to a longitudinal direction of the second cavity.

According to an embodiment, the antenna is entirely arranged inside of the first cavity.

According to an embodiment, an integrated circuit chip configured to receive a radio frequency signal of the antenna and/or to deliver a radio frequency signal to the antenna is intended to be assembled on the printed circuit board, and a radio frequency transmission line of the printed circuit board is configured to couple the chip assembled on the board to the antenna.

According to an embodiment, the transmission line comprises a bandpass radio frequency filter coupling the chip to the antenna, the filter preferably being a filter integrated to the substrate of the printed circuit board, or a filter filled with air integrated to the substrate of the printed circuit board.

According to an embodiment, the first and second packages are configured to block radio frequency waves, the first and second packages for example being made of a metal such as aluminum, of a metal alloy such as a metal alloy comprising aluminum, of plastic coated with a metal such as aluminum, or of plastic coated with a metal alloy such as a metal alloy comprising aluminum.

According to an embodiment, the connector is configured for radio frequency transmissions at 60 GHz.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIGS. 2A to 2D illustrate a second removable portion of the connector of FIGS. 1A to 1C according to an embodiment;

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, usual applications where wired or wireless radio frequency data transmissions may be implemented have not been detailed, the described embodiments being compatible with these usual applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The inventors here provide a radio frequency connector mechanically configurable between a configuration for wireless radio frequency data transmission and a configuration for wired radio frequency data transmission, via a plastic or dielectric waveguide in this last case. The provided connector comprises a first portion comprising a package and a printed circuit board provided with a radio frequency antenna, and a second removable portion comprising another package in which a plastic or dielectric waveguide is held in place. When the package of the second removable portion is removably attached, or fastened, or assembled, or mounted, to the package of the first portion of the connector, the connector allows a wired data transmission. Further, when the second removable portion is separated from the first portion of the connector, the connector is adapted to a wireless data transmission, preferably by respecting the radio frequency transmission standards in force in the considered transmission band.

Figure 1A:
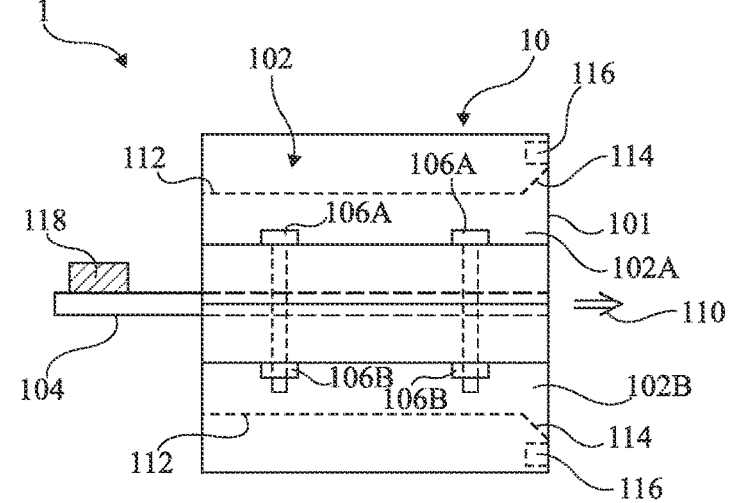
FIGS. 1A to 1C illustrate a first portion of a radio frequency connector according to an embodiment.
Figure 1B:
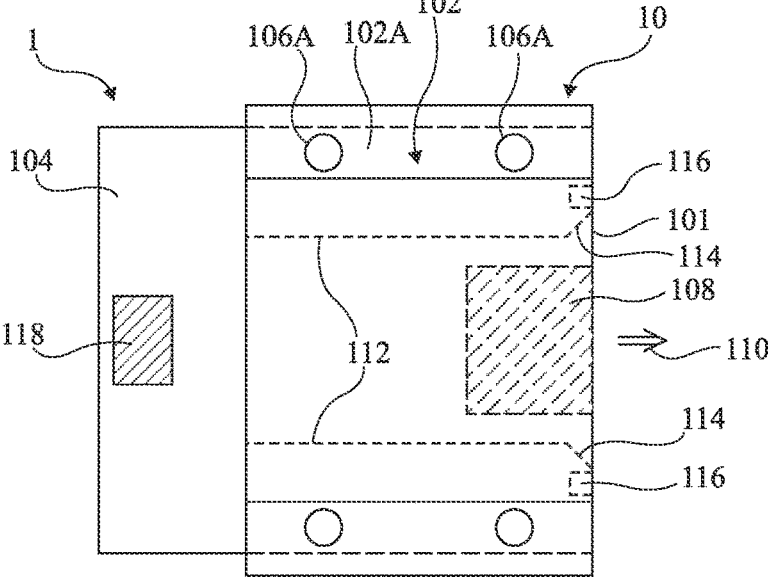
Figure 1C:
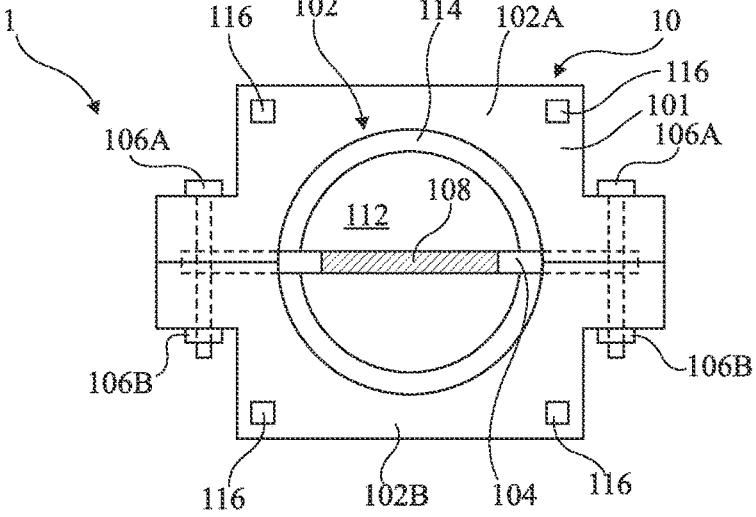

FIGS. 1A, 1B, and 1C schematically illustrate a first portion 10 of such a radio frequency connector 1 according to an embodiment.

More particularly, FIG. 1A is a side view of the portion 10 of connector 1, FIG. 1B is a top view of the portion 10 of connector 1, and FIG. 1C is a front view of the portion 10 of connector 1, that is, a view of a surface 101 of the portion 10 of connector 1 intended to cooperate with a surface of a second removable portion (not shown) of connector 1. In FIGS. 1A to 1C, connector 1 is in a wireless data radio frequency configuration, and the second removable portion of connector 1 is thus not attached to the portion 10 of connector 1.

The portion 10 of connector 1 comprises a package 102 and a printed circuit board 104. Package 102 is assembled to board 104.

As an example, as shown in FIGS. 1A, 1B, and 1C, package 102 comprises two portions 102A and 102B arranged on either side of board 104, portions 102A and 102B being held together or fastened to each other. The upper portion 102A of package 102 partly rests on an upper surface of board 104 and board 104 partly rests on the lower portion 102B of package 102, so that the two portions 102A and 102B sandwich board 104 and hold it in place in package 102.

As an example, portions 102A and 102B of package 102 are fastened to each other by fastening elements, for example, assemblies of a screw 106A and of a nut 106B, although portions 102A and 102B may also be glued to each other by glue or fastened to each other by any other adapted means known by those skilled in the art. As an example, in the case where portions 102A and 102B are glued to each other, alignment devices, for example, alignment pins, may be provided.

According to an embodiment, screws 106A cross board 104, which enables to improve the mechanical holding of board 104 in package 102.

According to an embodiment, as can in particularly be seen in FIG. 1C, package 102, that is, each of the portions 102A and 102B which form it in this example, may be thinner at the locations where screws 106A cross package 102.

In another example, not shown, package 102 may be formed in one piece, for example, by a molding method. Package 102 then comprises, for example, a slot into which board 104 may be inserted, fastening elements such as glue or screws 106A and nuts 106B then enabling to fasten board 104 to package 102.

Board 104 comprises a radio frequency antenna 108 (hatched in dotted lines in FIG. 1B and hatched in FIG. 1C).

In the illustrated embodiment, antenna 108 is configured to transmit a radio frequency field in a direction 110 parallel to the main surfaces (upper and lower) of board 104, antenna 108 is then arranged along an edge of board 104.

As an example, antenna 108 is an antipodal linear tapered slot antenna or ALTSA antenna well known by those skilled in the art. Antenna 108 may also be a Vivaldi antenna.

According to an embodiment, package 102 defines or comprises a cavity 112 (in dotted lines in FIGS. 1A and 1B) having a circular transverse cross-section, for example, a cylindrical cavity, around antenna 108. In other words, antenna 108 is arranged, preferably entirely, inside of cavity 112. Cavity 112 is filled with air around antenna 108.

Air cavity 112 emerges onto surface 101 of package 102, that is, the surface 101 intended to cooperate with a surface of the removable portion of connector 1 in a wired transmission configuration. Further, cavity 112 is longitudinally aligned with the transmit direction 110 of antenna 108, so that the field emitted by the antenna comes out of cavity 112 at the level of surface 101, substantially orthogonally to this surface 101. Antenna 108 is then arranged on the side of surface 101. As an example, an edge of board 104 arranged on the side of surface 101 is flush with surface 101, or is slightly recessed, for example, by less than one millimeter, or even by less than one half-millimeter, with respect to surface 101.

The wall of cavity 112 is configured to block radio frequency waves, or, in other words, the wall of cavity 112 is a radio frequency wave shield. This help prevent the field antenna 108 radiates from disturbing the environment of connector 1, except in direction 110. In other words, the wall of cavity 112 takes part in improving the transmission directivity of the antenna. Still in other words, the wall of cavity 112 takes part in increasing the antenna gain with respect to the case where package 102 would be absent. The wall of cavity 112 also helps prevent radio frequency waves originating from the environment of connector 1 from disturbing antenna 108.

The wall of cavity 112 is may be made of a material configured to block (reflect) radio frequency waves, for example, a metal such as aluminum or a metal alloy such as an aluminum-based metal alloy. More generally, this material may be any metallic material having a high electric conductivity (e.g., an electric conductivity for example greater than 5×10E6 S/m), for example, silver, copper, iron, gold, nickel, or an alloy of these metals. However, aluminum is preferred since is it has a low cost, is easy to machine and is light. As an example, package 102 is entirely made of this material blocking radio frequency waves or is made of plastic coated with this material, for example, of metallized plastic, at least over the wall of cavity 112, or is made of plastic filled with a metal material with a high electric conductivity. The diameter of cavity 112 around antenna 108 is, for example, selected to improve the antenna gain compared to the case where antenna 108 would not be arranged in cavity 112 (e.g., the case where package 102 is omitted). Indeed, cavity 112 then acts as a circular waveguide guiding the field transmitted by the antenna. However, to avoid disturbing antenna 108, the diameter of the cavity is, for example, selected to be sufficiently large (e.g., greater than the width of antenna 108).

Preferably, the diameter of cavity 112 increases towards surface 101. This enables, as will be seen hereafter, a decrease, or even a suppression, of the disturbances, by elements of connector 1, of the coupling of antenna 108 to the waveguide of the removable portion of connector 1 in a wired radio frequency transmission configuration. For example, according to an embodiment, cavity 112 has a chamfer 114 on the side of surface 101.

Package 102 comprises removable fastening elements 116 configured to allow a removable fastening of the second portion of connector 1 to portion 10 of connector 1. These fastening elements are for example intended to cooperate with corresponding removable fastening elements of the removable portion of connector 1.

In the shown example, package 102 comprises magnets 116 on the side of surface 101, magnets 116 for example being flush with surface 101. In another example, not illustrated, package 102 comprises holes crossing package 102 perpendicularly to surface 101, in which screws are inserter to removably fasten the two portions of connector 1 together. It is within the abilities of those skilled in the art to implement other removable fastening means.

Board 104 is intended to be assembled with an integrated circuit chip 118 configured to receive a radio frequency signal originating from antenna 108 and/or to deliver a radio frequency signal to be transmitted to antenna 108. In FIGS. 1A and 1B, chip 118 is shown as being assembled on board 104.

Chip 118 is coupled to antenna 108. Although this is not shown in FIGS. 1A, 1B, and 1C, board 104 comprises a radio frequency transmission line coupling chip 118 to antenna 108. This transmission line is for example a microstrip line, a SIW waveguide, or an assembly of a microstrip line and of a SIW waveguide. This transmission line may also be a coplanar line or a "stripline"-type line. According to an embodiment, chip 118 is directly assembled on the transmission line, for example, by welding or soldering, which enables decreased losses. As an example, chip 118 comprises a ball grid array or BGA enabling assembly, for example, by welding or soldering chip 118 directly onto the transmission line.

According to an embodiment, the transmission line is coupled to antenna 108 via a bandpass radio frequency filter (not shown), for example, centered on the operating frequency of the connector. In other words, the transmission line of board 104 comprises a filter coupling antenna 108 and chip 118. The filter for example enables the radio frequency power transmitted by antenna 108 to be effectively within a desired frequency range. As an example, when the connector is configured to operate at 60 GHz, the filter may be configured so that, in a wireless transmission configuration, 99% of the power of the field transmitted by antenna 108 is within the frequency range from 57 GHz to 64 GHz, in accordance with the ETSI EN 305550 specification. The implementation of such a filter is within the abilities of those skilled in the art.

According to an embodiment, the transmission line comprises a SIW waveguide, and the filter is formed in this SIW waveguide or, in other words, is integrated to the SIW waveguide of the transmission line. As compared with the case where the filter would be a component assembled on board 104, this enables limiting losses and to decreasing the bulk of connector 1. The forming of this filter integrated to the SIW waveguide is within the abilities of those skilled in the art. The forming of the filter in a SIW waveguide takes advantage of the fact that it is sufficient to add vias to the existing SIW waveguide, which only slightly increases or does not increase the surface area of the SIW waveguide, the latter being present to deliver a radio frequency signal to the antenna or to receive a radio frequency signal from antenna 108.

In the embodiment described herein where the transmission direction 110 of antenna 108 is parallel to board 104, the filter is for example at least partly, preferably entirely, arranged in cavity 112 to limit radio frequency disturbances originating from the outside of connector 1, for example, radio frequency disturbances of antenna 108, given that the SIW waveguide directly precedes the antenna.

In a wireless radio frequency transmission configuration, connector 1 only comprises the portion 10 described hereabove and antenna 108 then transmits a radio frequency field in direction 110 or receives a radio frequency field in a direction opposite to direction 110. Such a wireless link is particularly adapted for data transmissions over distances relatively short as compared with the transmissions distances that can be reached in a wired transmission.

Figure 3:
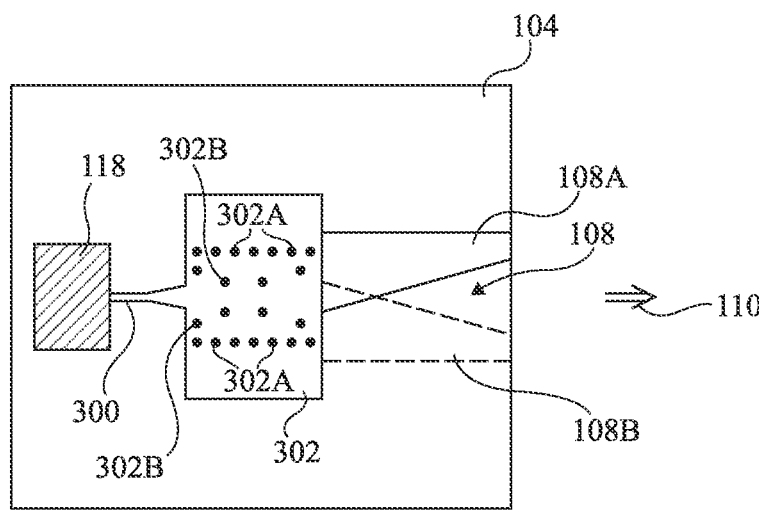
FIG. 3 illustrates in more detailed fashion a portion of the connector of FIGS. 1A to 1C and FIGS. 2A to 2D.

FIG. 3 shows a more detailed top view of board 104 according to an embodiment.

In this embodiment, the transmission line coupling chip 118 to antenna 108 comprises a microstrip line 300 and a SIW waveguide 302. Chip 118 is directly welded or soldered to microstrip line 300, and waveguide 302 couples line 300 to antenna 108. Conventionally for those skilled in the art, microstrip line 300 widens towards waveguide 302, to implement a transition between microstrip line 300 and waveguide 302.

Waveguide 302 comprises two metal plates defined in two different metal levels of PCB board 104. Two successions of aligned vias 302A coupling the metal plates together form two parallel walls defining the lateral edges of waveguide 302, the upper and lower edges of waveguide 302 being defined by the two metal plates.

In this embodiment, the transmission line comprises a low-pass filter, integrated to waveguide 302. The filter is formed by inductive vias 302B coupling the metal plates together. Vias 302B are arranged between the walls formed by vias 302A and form resonant cavities. The implementation of such a filter is within the abilities of those skilled in the art.

In this embodiment, antenna 108 is an ALTSA antenna. The antenna then includes two portions 108A and 108B of metal plates arranged in two different metal levels of PCB board 104, portion 108B (normally not shown in FIG. 3) being shown by dashed lines. For example, the two portions 108A and 108B are defined in the same metal levels as the metal plates of waveguide 302. The width of each of these portions 108A and 108B decreases linearly in the transmission direction 11o of antenna 108. The forming of such an antenna is within the abilities of those skilled in the art.

Figure 2D:
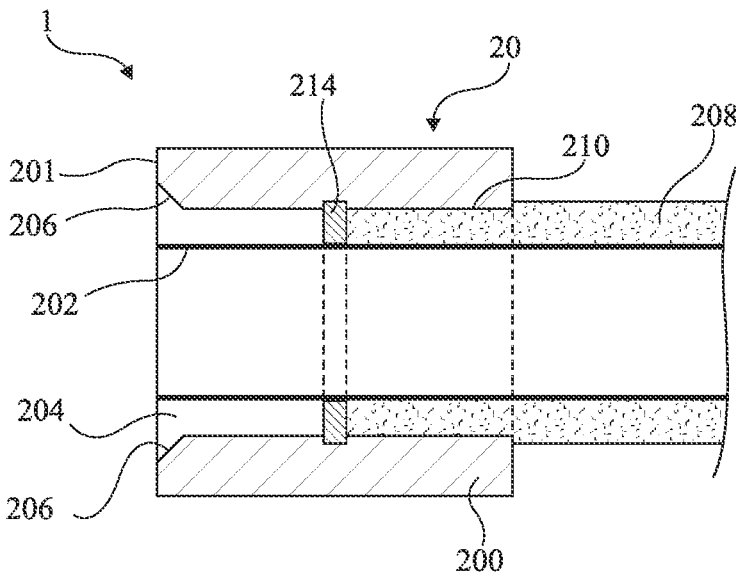

FIGS. 2A to 2D illustrate a removable portion 20 of the connector 1 of FIGS. 1A to 1C according to an embodiment. More particularly, FIG. 2A is a side view of this portion 20 of connector 1, FIG. 2B is a top view of the removable portion 20 of connector 1, FIG. 2C is a front view of portion 20 of connector 1, that is, a view of a surface 201 of the portion 20 of connector 1 intended to cooperate with surface 101 of portion 10 of connector 1 (FIGS. 1A, 1B, and 1C), and FIG. 2D is a cross-section view taken in plane DD of FIG. 2B.

The removable portion 20 of connector 1 comprises a package configured to be assembled with a dielectric or plastic waveguide 202 having a circular transverse cross-section. In FIGS. 2A to 2D, package 200 and waveguide 202 are shown as being assembled to each other. In this example, as illustrated in FIG. 2C, waveguide 202 is of the type described in patent application WO 2017191409, and thus comprises a PTFE tube, for example, made of the material designated by trade name Teflon, provided with a cross having two orthogonal PTFE arms, for example, made of Teflon, arranged in the tube.

According to an embodiment, package 200 defines or comprises a cavity 204 (in dotted lines in FIGS. 1A and 1B) having a circular transverse cross-section, for example a cylindrical cavity, around an end of waveguide 202 and, more exactly, around the end of waveguide 202 intended to be coupled to antenna 108 (FIGS. 1A, 1B, and 1C) in a wired transmission configuration. The expression end of the waveguide here means a longitudinal portion of waveguide 202 extending all the way to an end of the waveguide. The diameter of cavity 204 is greater than the (external) diameter of waveguide 202, so that, around the end of waveguide 202, cavity 204 is filled with air.

Cavity 204 emerges onto surface 201 of package 200, that is, the surface 201 intended, or configured, to cooperate with the surface 101 of portion 10 of connector 1 (FIGS. 1A, 1B, and 1C) in a wired transmission configuration. Further, cavity 204 is longitudinally aligned with the longitudinal direction of waveguide 202, so that an exposed transverse cross-section of waveguide 202 is opposite antenna 108, and is arranged perpendicularly to direction 110 (FIGS. 1A and 1B), in a wired transmission configuration. As shown in FIGS. 2A to 2D, package 200 is preferably configured so that the end of waveguide 202 is flush with surface 201, or is slightly recessed, for example by less than one millimeter, preferably by less than one millimeter, with respect to surface 201.

The wall of cavity 204 is configured to block radio frequency waves. This helps avoid, in a wired transmission configuration, coupling between antenna 108 and waveguide 202 from being disturbed by radio frequency waves originating from the environment of connector 1. For this purpose, the wall of cavity 204 is made of a material configured to block radio frequency waves, for example, made of a metal such as aluminum or of a metal alloy such as an aluminum-based metal alloy. More generally, this material configured to block radio frequency waves may be one of the materials configured to block the radio frequency waves given as an example in relation with FIGS. 1A to 1C.

As an example, package 200 is entirely made of this material configured to block radio frequency waves, or is made of plastic coated with this material, at least on the wall of cavity 204.

Preferably, the diameter of cavity 204 increases towards surface 201. This enables, as will be seen hereafter, a decrease, or even a suppression, of the disturbances, by the elements of connector 1, of the coupling of antenna 108 to waveguide 202 in a wired transmission configuration. As an example, according to an embodiment, cavity 204 has a chamfer 206 on the side of surface 201.

Package 200 is configured to hold waveguide 202 in place.

In the illustrated embodiment, waveguide 202 is surrounded, upstream of the end of waveguide 202 arranged in cavity 204, by a foam sheath 208, for example, a PTFE foam such as a Teflon foam. To hold waveguide 202 in place, package 200 is then configured to tightly encircle a portion of waveguide 202 coated with sheath 208, by exerting a pressure on sheath 208.

As an example of embodiment, as shown in FIGS. 2A, 2B, and 2D, cavity 204 extends, on the side opposite to surface 201, in a cavity 210 having a circular transverse cross-section, for example, a cylindrical cavity 210, having a diameter smaller than the outer diameter of sheath 208. Thus, when a longitudinal portion of waveguide 202 coated with sheath 208 is inserted into cavity 210, package 200 tightly encircles sheath 208 and exerts pressure on sheath 208, which enables package 200 to hold waveguide 202. As shown in FIGS. 2A to 2D, cavities 204 and 210 may have the same diameter. Further, in this example, the assembly of cavities 204 and 210 form an opening thoroughly crossing package 200 in a direction orthogonal to surface 201.

In the example illustrated in FIGS. 2A to 2D, package 200 comprises two portions 200A and 200B arranged on either side of waveguide 202, portions 200A and 200B being held, or fastened, together. Each of the two portions 200A and 200B defines a portion of cavity 204 and, in this example, of cavity 210. The two portions 200A and 200B are in contact with each other, for example, at the level of a contact plane parallel to the longitudinal direction of cavity 204. The two portions 200A and 200B tightly encircle the sheath 208 of waveguide 202 at the level of cavity 210, which enables to mechanical hold waveguide 202 in package 200.

As an example, the portions 200A and 200B of package 200 are fastened to each other by fastening elements, for example, assemblies of a screw 212A and of a nut 212B, although portions 200A and 200B may also be glued to each other or fastened to each other by any other adapted means known by those skilled in the art.

According to an embodiment, as can in particular be seen in FIG. 2C, package 200, that is, each of the portions 200A and 200B which form it in this example, may be thinner at the locations where screws 212A cross package 200.

In another example, not shown, package 200 may be formed in one piece. Waveguide 202 is then force fit into cavities 204 and 210.

Further, in the case where waveguide 202 is coated with foam sheath 208 upstream of the end thereof which is arranged in cavity 204 according to an embodiment, package 200 comprises, on the side of cavity 204 opposite to surface 201, a device for stopping sheath 208, so that when the end of waveguide 202 which is not coated with sheath 208 is arranged in cavity 204, sheath 208 comes into contact with the stop device.

More particularly, according to an embodiment, package 200 comprises a ring 214 on the side of cavity 204 opposite to surface 201. Ring 214 is arranged perpendicularly to the longitudinal direction of cavity 204. Ring 214 then forms the bottom of cavity 204, on the side opposite to surface 201. In this example where cavity 204 continues in cavity 210, ring 214 is arranged at the junction between cavities 204 and 210. Ring 214 has an inner diameter greater than the (outer) diameter of sheath 208, so that only a portion of waveguide 202 non-coated with sheath 208 can run through ring 214 and sheath 208 abuts against ring 214, as illustrated, in particular, in FIG. 2D.

As an example, ring 214 is mechanically held in place in package 200 by a trough or groove formed in package 200, having the periphery of ring 214 inserting into it (FIG. 2D). According to another example, not illustrated, ring 214 corresponds to a portion of package 200, ring 214 and package 200 forming one piece, for example, by providing for portion 200A of the package to comprise a portion of ring 214 and for portion 200B of the package to comprise the other portion of ring 214.

As an example, ring 214 is made of the same material as the package or of the same material as waveguide 202.

Due to the fact that the sheath 208 of waveguide 202 is not present in cavity 204 where the coupling between antenna 108 and waveguide 202 takes place in the wired transmission configuration, the coupling is not disturbed. It is within the abilities of those skilled in the art to select the distance between surface 201 and the sheath stop device, for example, ring 214, so that the stop device and sheath 208 do not disturb the coupling between antenna 108 and waveguide 202.

Package 200 comprises fastening elements 216 configured to allow a removable fastening of portion 20 of connector 1 to portion 10 of connector 1 (FIGS. 1A to 1C). Fastening elements 216 are for example intended to cooperate with corresponding removable fastening elements 116 of portion 10 of connector 1.

In the shown example, package 202 comprises magnets 216 on the side of surface 201, magnets 216 being for example flush with surface 201. In another example, not illustrated, package 200 comprises holes crossing package 200 orthogonally to surface 201, to insert screws therein to be able to removable fasten the two portions of connector 1 together. It is within the abilities of those skilled in the art to implement other removable fastening means.

Of course, in this example where portions 10 and 20 of connector 1 are intended to be removably attached to each other by fastening elements such as magnets 116 and 216, each magnet 216 is arranged in package 200 to cooperate with a corresponding magnet 116 of package 102 (FIGS. 1A to 1C).

Figure 4A:
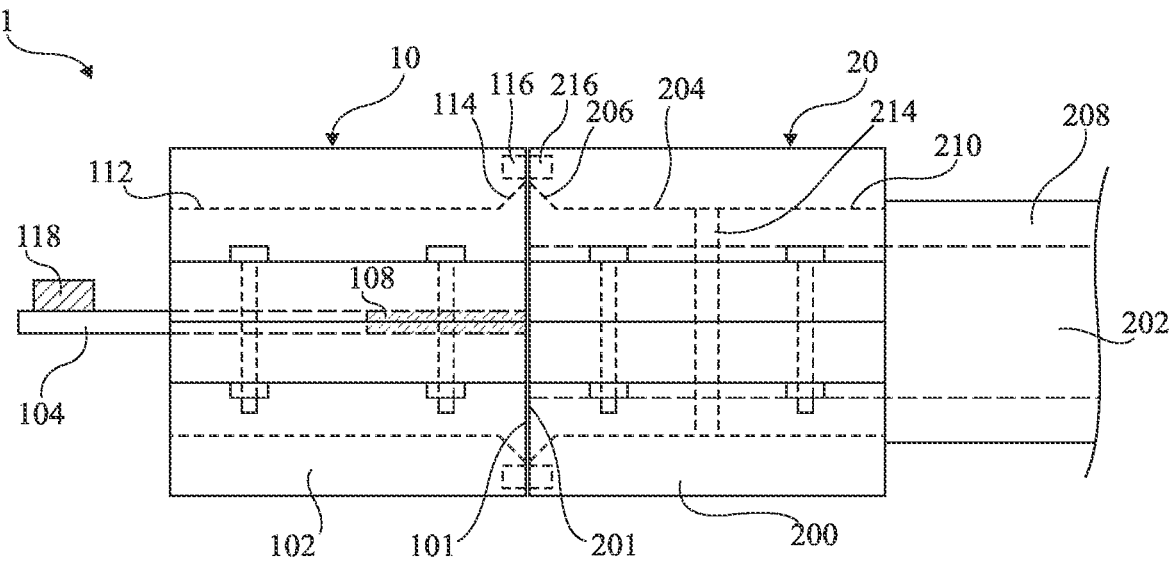
FIGS. 4A and 4B illustrate the connector of FIGS. 1A to 1C and FIGS. 2A to 2D when the second removable portion of the connector is attached to the first portion of the connector.
Figure 4B:
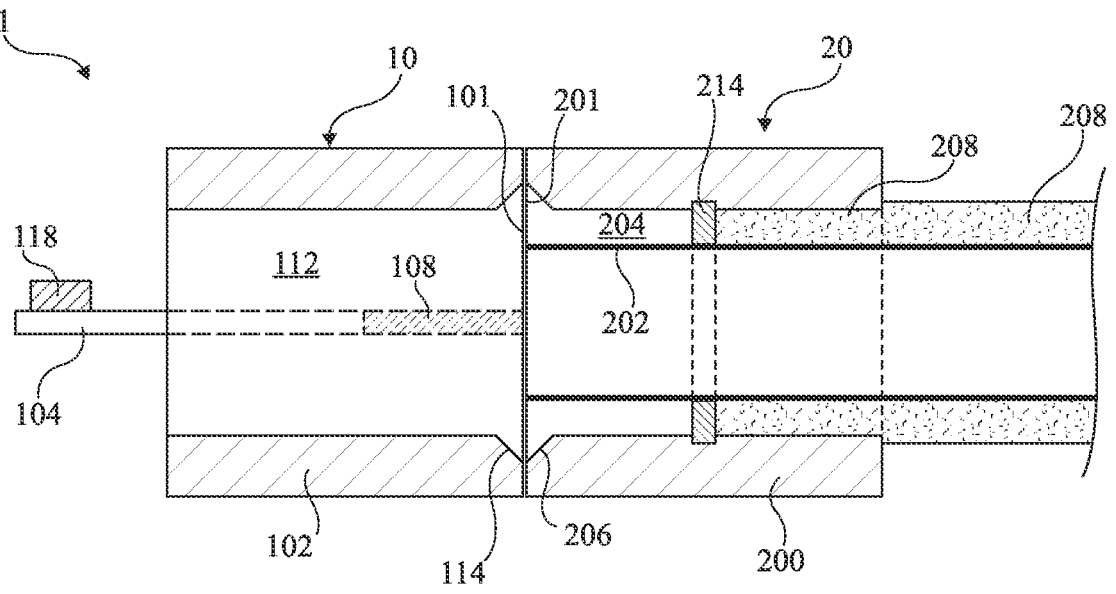

FIGS. 4A and 4B illustrate the previously described connector when the removable portion 20 of connector 1 is attached to portion 10 of connector 1, that is, when the connector is in a wired transmission configuration. More particularly, FIG. 4A is a side view of connector 1, corresponding to the views of FIGS. 1A and 2A, FIG. 4B being a cross-section view taken in plane DD of FIG. 2B.

Although this has not been previously indicated, the diameter of cavity 112 at the level of surface 101 and the diameter of cavity 204 at the level of surface 201 are preferably substantially equal, for example, equal.

Further, portions 10 and 20 of connector 1, particularly their respective fastening elements 116 and 216, are configured, when they are removably fastened together, so that their surfaces 101 and 201 are in contact and that cavities 112 and 204 are placed end-to-end. When they are placed end-to-end, the longitudinal direction of cavity 112 is aligned with that of cavity 204.

In other words, when the two portions 10 and 20 of connector 1 are removably fastened to each other, cavities 112 and 204 form an air cavity with a circular transverse cross-section having the coupling region between antenna 108 and waveguide 202 arranged therein.

Due to the fact that each of cavities 112 and 204 has a wall blocking radio frequency waves, the cavity formed by cavities 112 and 204 placed end-to-end is also configured to block radio frequency waves originating from the outside of connector 1, which prevents the coupling between antenna 108 and waveguide 202 from being disturbed.

Further, in an embodiment where the diameter of cavity 112, respectively 204, increases towards surface 101, respectively 201, the diameter of the air cavity formed by the assembly of cavities 112 and 204 placed end-to-end is larger at the level of the coupling area of antenna 108 with waveguide 202. This enables to limit, or even to eliminate, the influence of packages 102 and 200, for example, of the metal walls of their respective cavities 112 and 204, on this coupling.

Further, due to the fact that the longitudinal direction of cavity 112 is aligned with the transmission direction of antenna 108 and that the longitudinal direction of the end of waveguide 204 is aligned with the longitudinal direction of the end of waveguide 202, when portions 10 and 20 of connector 1 are removably attached to each other, the transmission direction of antenna 108 is self-aligned with the longitudinal direction of the end of waveguide 202, which allow the coupling of antenna 108 with waveguide 202.

Although this is not shown in FIGS. 4A and 4B, since the edge of board 104 is preferably slightly recessed with respect to the surface 101 of portion 10 of connector 1 and/or the end of waveguide 202 is, preferably, slightly recessed with respect to the surface 201 of portion 20 of connector 1, there is a space, for example, smaller than one millimeter, between board 104 and the end of waveguide 202. The value of this space may be adapted by those skilled in the art according to a targeted performance of the coupling between antenna 108 and waveguide 202. Preferably, board 104 and waveguide 202 are not in contact.

The connector 1 previously described in relation with FIGS. 1A to 1C, 2A to 2D, 3, and 4A to 4B thus enables to implement a wired radio frequency transmission when portion 20 of connector 1 is removably attached to portion 10 of connector 1, and a wireless radio frequency transmission when portion 20 of connector 1 is not attached to portion 10 of the connector, without it being necessary to modify chip 118, board 104, and package 102.

In particular, as compared with the connector discussed in the previously-mentioned article "An 18 Gbps Polymer Microwave Fiber (PMF) Communication Link in 40 nm CMOS," connector 1 allows a wireless radio frequency transmission. It could be believed that removing the waveguide from the package of this article would have been sufficient to make this connector compatible with a wireless transmission. However, the package would have probably disturbed the transmission of the conical slot coupler, which would not have transmitted as powerful a field as what is enabled by the previously-described connector 1. Further, the connector of the above-mentioned article would not allow a wireless radio frequency transmission complying with the standards in force in certain frequency bands, such as for example the 60-GHz frequency band, which is allowed by connector 1 provided with the filter coupling antenna 108 and chip 118. It could also have been believed that removing the waveguide and the package of the connector of this article would have been sufficient to make it compatible with a wireless transmission. However, the antenna gain of the connector would not have been as high as the antenna gain of connector 1 due to the fact that in connector 1, package 102 takes part in the transmission directivity of antenna 108 and in the increase of its gain.

Further, connector 1 enables holding waveguide 202 together with package 200, which is not the case for the connector described in the above-mentioned article where the waveguide is just inserted into the package, without a specific device enabling the fastening of the waveguide together with the package.

As an example, the inventors have formed a connector 1 configured for a 60-GHz radio frequency transmission. The formed connector 1 complies with the constraints of the ETSI EN 305550 specification for a wireless transmission configuration. The formed connector 1 is configured to be used with a waveguide such as described in patent application WO 2017191409 for a wired transmission configuration. For this embodiment, board 104, for example, has a width (taken in the transmission direction 110 of antenna 108) in the order of 16 mm and a length in the order of 30 mm. Further, for this embodiment, antenna 108 is an ALTSA antenna occupying a surface area in the order of 10 mm*10 mm, for example, a surface area of 6.5 mm*5.7 mm. For this embodiment, the inventors have observed that connector 1 would lead to a transmission coefficient between chip 118 and waveguide 202 greater than −2.5 dB and to reflections between chip 118 and the transmission line on which it is assembled smaller than −10 dB.

Various embodiments and variants have been described. Those skilled in the art will understand that certain features of these various embodiments and variants may be combined, and other variants will occur to those skilled in the art.

In particular, a transmission line of board 104 comprising a portion implemented by a SIW waveguide into which a bandpass filter may be integrated has been described. This portion of an SIW waveguide possibly provided with the bandpass filter may be replaced with an air filled substrate integrated waveguide or AFSIW, possibly provided with the bandpass filter integrated to the AFSIW waveguide.

Further, although embodiments for which antenna 108 is configured to transmit in a direction 110 parallel to board 104 have been described, antenna 108, for example, a patch antenna, may be configured to transmit in a direction orthogonal to board 104. It is within the abilities of those skilled in the art to adapt the above description to an antenna 108 transmitting orthogonally to board 104, for example, by providing for the longitudinal direction of cavity 112 to be orthogonal to board 104 and for surface 101 of the package to then be the upper surface of the package.

Further, although a cavity 112 thoroughly crossing package 102 has been described and illustrated, it may be provided for cavity 112 to be closed on the side opposite to surface 101, for example, by providing for cavity 112 to have a conical shape on the side opposite to surface 101.

Embodiments where the cavity 204 of package 200 continues in a cavity 210 intended to receive a portion of waveguide 202 coated with sheath 208 and where a ring 214 for stopping sheath 208 is arranged between cavities 204 and 210 have been described. It is possible to omit cavity 210 by providing, for example, for the surface of ring 214 opposite to cavity 204 to be flush with a surface of package 200 opposite to surface 21, and for this surface of the package to comprise hooks or pads or a mechanical device exerting a pressure on sheath 208 when the end of waveguide 202 comprising no sheath 208 is inserted into cavity 204 and sheath 208 abuts against ring 214.

It will also be within the abilities of those skilled in the art to modify the operating frequency of connector 1, that is, the frequency of the radio frequency field transporting most of the power transmitted by antenna 108, for example, by modifying the central frequency of the filter and/or by modifying the dimensions and the shape of antenna 108.

Further, the above-described connector 1 is not limited to a use with a dielectric waveguide, or plastic waveguide, of the type described in previously-mentioned application WO 2017191409, and may be used with any type of dielectric radio frequency waveguide having a circular transverse cross-section.

Finally, the practical implementation of the described embodiments and variations is within the abilities of those skilled in the art based on the functional indications given hereinabove. In particular, it is within the abilities of those skilled in the art to select the diameters of cavities 112, 204, and possibly 210 according to the targeted application (diameter of waveguide 202, diameter of sheath 208, type of antenna 108, operating frequency, etc.), for example, by using a computer-assisted simulation tool such as the software designated by trade name Ansys HFSS. More generally, it will be within the abilities of those skilled in the art to adapt the shape and/or the dimensions of packages 102 and 200 according to the targeted application.

The invention claimed is:

1. A connector mechanically configurable between a wireless radio frequency transmission and a wired radio frequency transmission via a cylindrical dielectric radio frequency waveguide, the connector comprising:

a first package assembled to a printed circuit board provided with a radio frequency (RF) antenna; and a second package configured to be assembled to the waveguide, wherein the second package is configured to be removably assembled to the first package in the wired radio frequency transmission configuration and is separated from the first package in the wireless radio frequency transmission configuration, wherein the connector is operable in the wireless radio frequency transmission configuration when the second package is separated from the first package such that radio frequency signals radiate from the RF antenna into free space without propagation through the waveguide, and wherein the connector is operable in the wired radio frequency transmission configuration when the second package is removably assembled to the first package such that radio frequency signals are coupled from the RF antenna into the waveguide for guided-wave transmission.

2. The connector according to claim 1, wherein:

the first package comprises a first cavity having a circular transverse cross-section around the RF antenna, the first cavity emerging onto a first surface of the first package and having a wall made of a material configured to block radio frequency waves;

the second package comprises a second cavity having a circular transverse cross-section around an end of the waveguide when the waveguide is assembled to the second package, the second cavity emerging onto a second surface of the second package and having a wall made of a material configured to block radio frequency waves; and the first and second surfaces are configured to be in contact and the first and second cavities are configured to be placed end-to-end in the wired radio frequency transmission configuration.

3. The connector according to claim 2, wherein the first cavity and the second cavity placed end-to-end define a third cavity, an area of coupling of the RF antenna to the waveguide being arranged in the third cavity.

4. The connector according to claim 3, wherein a diameter of the third cavity is larger at a level of the area of coupling.

5. The connector according to claim 3, wherein the first cavity comprises a chamfer on a side of the first surface and the second cavity comprises a corresponding chamfer on a side of the second surface.

6. The connector according to claim 2, wherein:

the first cavity is longitudinally aligned with a transmission direction of the RF antenna and the second cavity is longitudinally aligned with the end of the waveguide when the waveguide and the second package are assembled together; and the second cavity is longitudinally aligned with the first cavity when the second package is removably assembled to the first package.

7. The connector according to claim 2, wherein:

the waveguide is surrounded with a foam sheath upstream of the end;

the second package is configured to tightly encircle the foam sheath of the waveguide while exerting a pressure on the foam sheath when the waveguide and the second package are assembled together; and the foam sheath does not extend to the end of the waveguide in the second cavity.

8. The connector according to claim 7, wherein:

the second package comprises, on a side of the second cavity opposite to the second surface, a ring having an inner diameter greater than the diameter of the waveguide and smaller than the diameter of the foam sheath; and the foam sheath abuts against the ring when the waveguide and the second package are assembled together.

9. The connector according to claim 2, wherein the end of the waveguide is flush with the second surface, or is recessed by less than one millimeter with respect to the second surface, when the waveguide and the second package are assembled together.

10. The connector according to claim 2, wherein:

the second package comprises two portions fastened to each other, each of the two portions defining a portion of the second cavity; and a contact plane between the two portions is parallel to a longitudinal direction of the second cavity.

11. The connector according to claim 2, wherein the RF antenna is arranged entirely inside the first cavity.

12. The connector according to claim 2, wherein an integrated circuit chip configured to receive a radio frequency signal of the RF antenna and/or to deliver a radio frequency signal to the RF antenna is intended to be assembled on the printed circuit board, and a radio frequency transmission line of the printed circuit board is configured to couple the integrated circuit chip assembled on the printed circuit board to the RF antenna.

13. The connector according to claim 12, wherein:

the radio frequency transmission line comprises a bandpass radio frequency filter coupling the integrated circuit chip to the RF antenna; and the bandpass radio frequency filter is integrated to a substrate of the printed circuit board, or the bandpass radio frequency filter is filled with air and integrated to the substrate of the printed circuit board.

14. The connector according to claim 1, wherein the first and second packages are configured to block radio frequency waves.

15. The connector according to claim 14, wherein the first package and the second package are made of:

a metal;

a metal alloy;

plastic coated with the metal; or plastic coated with the metal alloy.

16. The connector according to claim 15, wherein the metal or the metal alloy comprises aluminum.

17. The connector according to claim 1, configured for radio frequency transmissions at 60 GHz.

18. A connector mechanically configurable between a wireless radio frequency transmission and a wired radio frequency transmission via a dielectric radio frequency waveguide, the connector comprising:

a first package assembled to a printed circuit board provided with a radio frequency antenna, the first package comprising a first cavity having a transverse cross-section around the RF antenna, wherein the first cavity emerges onto a first surface of the first package, the first cavity has a wall made of a material configured to block radio frequency waves, and the first cavity is configured to be removably assembled to a second package in the wired radio frequency transmission configuration and is separated from the second package in the wireless radio frequency transmission configuration, wherein the second package is configured to be assembled to the waveguide, the second package comprises a second cavity having a transverse cross-section around an end of the waveguide when the waveguide is assembled to the second package, the transverse cross-section of the first cavity has the same shape as the transverse cross-section of the second cavity, the second cavity emerging onto a second surface of the second package and has a wall made of a material configured to block radio frequency waves, the first and second surfaces being configured to be in contact and the first cavity and the second cavity are configured to be placed end-to-end in the wired radio frequency transmission configuration.

19. The connector of claim 18, wherein the connector is operable in the wireless radio frequency transmission configuration when the second package is separated from the first package such that radio frequency signals radiate from the radio frequency antenna into free space without propagation through the waveguide, and wherein the connector is operable in the wired radio frequency transmission configuration when the second package is removably assembled to the first package such that radio frequency signals are coupled from the radio frequency antenna into the waveguide for guided-wave transmission.

20. A method of operating a connector mechanically configurable between a wireless radio frequency transmission and a wired radio frequency transmission via a cylindrical dielectric radio frequency waveguide, the method comprising:

affixing a first package to a second package, wherein:

the first package is assembled to a printed circuit board provided with a radio frequency antenna and comprises a first cavity having a transverse cross-section around the RF antenna, first cavity emerges onto a first surface of the first package, the second package comprises a second cavity having a transverse cross-section that has a same shape as the transverse cross-section of the first cavity, the second cavity emerges onto a second surface of the second package and has a wall made of a material configured to block radio frequency waves; and affixing the first package to the second package comprises placing the first and second surfaces in contact with each other such that the first and second cavities are placed end-to-end; and inserting the waveguide into the second cavity.

* * * * *